United States Patent [19]
Kohno et al.

[11] Patent Number: 4,977,584
[45] Date of Patent: Dec. 11, 1990

[54] CCD IMAGE SENSOR WITH VERTICAL OVERFLOW DRAIN

[75] Inventors: Akiyoshi Kohno; Atsushi Mikoshiba, both of Tokyo, Japan

[73] Assignee: NEC Corporation, Tokyo, Japan

[21] Appl. No.: 425,140

[22] Filed: Oct. 23, 1989

[30] Foreign Application Priority Data

Oct. 21, 1988 [JP] Japan .................. 63-266539

[51] Int. Cl.$^5$ .............. G11C 19/28; H01L 29/78; H04N 3/14
[52] U.S. Cl. .................. 377/58; 357/24; 358/213.19
[58] Field of Search ........... 357/24; 377/57-63; 358/213.19

[56] References Cited

U.S. PATENT DOCUMENTS

| 3,896,485 | 7/1975 | Early | 357/24 L R |
| 4,717,945 | 1/1988 | Yusa et al. | 357/34 L R |
| 4,884,142 | 11/1989 | Suzuki | 358/213.19 |
| 4,912,560 | 3/1990 | Osawa et al. | 358/213.19 |

Primary Examiner—Gene M. Munson
Attorney, Agent, or Firm—Sughrue, Mion, Zinn, Macpeak & Seas

[57] ABSTRACT

An image sensor is fabricated on an n type silicon substrate haivng a p type well overlain by a photo shield plate, and photo diodes are formed in the p type well and exposed through an opening in the photo shield plate to an optical image, in which the silicon substrate and the photo shield plate are biased so that punch through phenomena take place between the silicon substrate and the photo diodes for sweeping ineffectual electric charges into the substrate, thereby achieving an electronic shutter mode of operating without any complicate impurity profiles.

12 Claims, 14 Drawing Sheets

CCD IMAGE SENSOR WITH VERTICAL OVERFLOW DRAIN

FIELD OF THE INVENTION

This invention relates to a charge-coupled device and, more particularly, to a vertical overflow drain of the CCD image sensor capable of established into an electronic shutter mode of operation.

DESCRIPTION OF THE RELATED ART

A prior art charge coupled device (hereinunder abbreviated as "CCD") of the interline transfer type is used for fabricating an image sensor, and the image sensor largely comprises photo diode array associated with a plurality of vertical shift registors each implemented by a charge coupled device which in turn is associated with a horizontal shift registor also implemented by a charge coupled device. The image sensor is established into an accumulating mode and a read out mode of operation, and an optical image is converted into electric charges in the accumulating mode of operation. While the accumulated electric charges are read out through the vertical shift registors in a single vertical blanking period, the subsequent optical image is converted into fresh electronic charges. According to the NTSC (National Television System Committee) color system, the accumulating time period is adopted to be a sixty second, and, for this reason, the image sensor hardly reproduces an optical image from an object moving at a high speed without making an image on the display vague. In order to coped with this drawback, an electronic shutter mode of operation is proposed for shortening the effective accumulation time period.

One of the image sensor with the electronic shutter mode of operation is disclosed in a magazine entitled as "Video alpha" published by Photo Industry Publishing Company, 1987 August, pages 145 to 148. For better understanding of the Applicant's invention, the image sensor published in the magazine is briefly described with reference to FIGS. 1 and 2.

Referring to FIG. 1, the image sensor largely comprises a photo diode array PD arranged in rows and columns, a plurality of vertical shift registors VSR coupled to the columns of the photo diodes, respectively, a horizontal shift registor HSR coupled to the vertical shift registors VSR, and an overflow drain OFD coupled to the opposite ends of the vertical shift registors VSR.

The behavior of the image sensor shown in FIG. 1 is described with reference to FIG. 2 where the timing chart thereof is compared with a timing chart of the conventional image sensor without the electronic shutter mode of operation. The conventional image sensor without the electronic shutter mode of operation is responsive to a single read out pulse RD, and transfers all of the electronic charges in synchronization with a series of vertical transferring pulses VPL between two vertical blanking periods. Then, the accumulated electric charges are read out once, and the electric charge transferring operation is carried out in the forward direction only.

The image sensor with the electronic shutter mode of operation is established in the electronic shutter mode of operation in the vertical blanking period. Namely, two read out pulses RD1 and RD2 take place at a certain time interval in the vertical blanking period, and a series of high speed reversely transferring pulses 21 are supplied in the certain time interval. With the first read out pulse RD1, the photo diodes discharge the respective ineffectual electric charges to the vertical shift registers VSR, and the ineffectual electric charges are swept to the overflow drain OFD in synchronization with the high speed reversely transferring pulses 21. While sweeping the ineffectual electric charges, the photo diodes PD accumulate fresh or effectual electric charges in the presence of an optical image. Upon completion of the sweeping operation, the second read out pulse RD2 takes place for allowing the photo diodes PD to discharge the electric charges to the vertical shift registers VSR, and the vertical shift registers transfer the effectual electric charges to the outside thereof in synchronization with the vertical transferring pulses VPL. Thus, the optical image is effectively converted into electric charges during a time period T1 between the first and second read out pulses RD1 and RD2, and a shutter speed is fixedly defined by the time period T1. The image sensor thus arranged is fairly responsive to an optical image from a moving object, however, the shutter speed is fixed to a thousandth second.

If the shutter speed is fixed to a certain value, the image sensor can not respond to variation of illuminance, and an image sensor with a variable electronic shutter mode is reported in the same magazine. The image sensor with the variable electronic shutter mode is shown in FIG. 3 of the drawings, and comprises a photo diode array PD, a plurality of vertical shift registors VSR each implemented by a charge coupled device, a horizontal shift registor HSR also implemented by a charge coupled device, an overflow drain OFD, and a plurality of accumulation memories AM provided in association with the vertical shift registors VSR. The time period T1 is variable from a two hundreds and fiftieth second to a thousandth second by virtue of the accumulation memory AM. However, a problem is encountered in the image sensor shown in FIG. 3 in that a large number of memory stages are necessary for a wide variation of the shutter speed. This results in that a large amount of occupation area is consumed by the accumulating memories, and, accordingly, the chip size is enlarged. The more memory stages, the less transferred electric charges due to an extremely high frequency transferring pulse, then a clear image is hardly reproduced on the associated display.

Still another prior art image sensor is disclosed by Hamazaki et al. in "Interline Type CCD with High Sensitivity Responsive to the Minimum Illuminance of 51×", Nikkei Microdevices, 1987 October, pages 60 to 67. The image sensor reported by Hamazaki is capable of establishment into a variable electronic shutter mode of operation, and is characterized by a vertical overflow drain for sweeping ineffectual electric charges into the semiconductor substrate where the image sensor is fabricated. The image sensor provided with the vertical overflow drain is shown in FIG. 4A, and FIG. 4B shows the structure of a conventional image sensor for comparative usage. In FIG. 4A, the image sensor is fabricated on an n-type semiconductor substrate 41, and a first p type well 42 is formed in the substrate 41. In the first p type well 42 is formed an n-type impurity region 43 for providing a photo diode which is associated with a p-type impurity region 44 serving as a hole accumulating layer. In the first p type well 42, an n-type impurity region 45 provides a part of a vertical shift registor VSR together with a silicon transferring electrode 46. In the image sensor shown in FIG. 4A, a second p type well 47 is formed beneath the n-type impurity region 45 for restriction of smearer. The structure is covered with an aluminum photo shield plate 48 except for the photo diode, and channel stoppers 49 are provided for isolation. The conventional image sensor shown in FIG. 4B is similar in structure to the image sensor shown in FIG. 4A with the exception of the photo accumulator 44 and the second p type well 47, and, for this reason, the regions and layers are designated by like reference numerals used in FIG. 4A without any detailed description.

The image sensor shown in FIG. 4A provides the vertical overflow drain for sweeping the ineffectual electric charges into the semiconductor substrate 41 by virtue of the hole accumulating region 44. In detail, FIG. 5A illustrates the profile of the bottom edge Ec of the conduction band created around the photo diode in the vertical direction. In an accumulating mode of operation, the bottom edge Ec of the conduction band remains as indicated by real line due to a first biasing voltage level Vsub1 applied to the semiconductor substrate 41, and, for this reason, electric charges EL are accumulated in the photo diode. If the image sensor is established in the electronic shutter mode of operation, the semiconductor substrate 41 is biased with a second biasing voltage level Vsub2 different from the first biasing voltage level Vsub1 by a predetermined value. With the second biasing voltage level Vsub2, the potential barrier BR between the photo diode and the semiconductor substrate 41 is removed, and, accordingly, the bottom edge Ec is indicated by dash lines, thereby allowing the accumulated electric charges to be swept into the semiconductor substrate 41. This is because of the fact that the hole accumulating region 44 forces the photo diode to stay in the original position regardless of the variation of the biasing voltage level applied to the semiconductor substrate. However, if no hole accumulating region is incorporated in the image sensor such as an image sensor shown in FIG. 4B, the photo diode per se moves downwardly without removing the potential barrier BR upon variation of the biasing voltage level applied to the semiconductor substrate 41, and, for this reason, the accumulated electric charges are still confined in the photo diode. The image sensor shown in FIG. 4A is effective for increasing the ratio of open area, however, the structure is complicate, and, accordingly, the impurity profiles are less controllable. Moreover, a persistence is much liable to take place due to the complex control.

SUMMARY OF THE INVENTION

It is therefore an important object of the present invention to provide an image sensor which is variable in the shutter speed without any accumulating memories.

It is also an important object of the present invention to provide an image sensor which is fabricated on a small semiconductor chip.

It is still another object of the present invention to provide an image sensor which is simple in the structure of impurity profiles.

To accomplish these objects, the present invention proposes to sweep ineffectual electric charges from a photo diode into a semiconductor substrate by using the punch through phenomenon.

In accordance with the present invention, there is provided an image sensor of an interline transfer type fabricated on a semiconductor substrate of a first conductivity type and established into an electronic shutter mode and a charge transferring mode of operation, comprising: (a) a plurality of photo sensing elements arranged in rows and columns and operative to accumulate effectual electric charges in the electronic shutter mode of operation and ineffectual electric charges out of the electronic shutter mode of operation in the presence of optical images, the photo sensing elements being formed by a plurality of impurity regions of the first conductivity type defined in a well of a second conductivity type provided in the semiconductor substrate; (b) a plurality of vertical shift registers coupled to the columns of the photo sensing elements, respectively, and operative to receive the effectual electric charges from the photo sensing elements in the presence of a read out signal produced in a vertical blanking time period and to transfer the effectual electric charges in response to a multiple-phase vertical transferring signal in the charge transferring mode of operation, the vertical shift registors being formed in the well; (c) a horizontal shift registor coupled to the vertical shift registors for transferring the effectual electric charges fed from the vertical shift registors in response to a multiple-phase horizontal transferring signal; (d) a pulse producing unit operative to produce the multiple-phase vertical transferring signal, the multiple phase-horizontal transferring signal, a vertical driving signal and a horizontal driving signal; (e) a conductive photo shield plate provided over the well and having an opening exposing the photo sensing elements to the optical images; and (f) a biasing voltage controlling unit responsive to the vertical and horizontal driving signals for producing first and second biasing signals and operative to respectively supply the first and second biasing signals to the photo shield plate and the semiconductor substrate before producing the read out signal, the electronic shutter mode of operation being established in a lapse of time from recoveries of the first and second biasing voltage signals to a production of the read out signal, in which a vertical overflow drain is formed by a combination of the semiconductor substrate, the well and the impurity regions, and in which the first and second biasing voltage signals have respective voltage levels selected in such a manner that punch through phenomena take place in the vertical overflow drain for sweeping the ineffectual electric charges into the semiconductor substrate.

BRIEF DESCRIPTION OF THE DRAWINGS

The features and advantages of an image sensor according to the present invention will be more clearly understood from the following description taken in conjunction with the accompanying drawings in which.

PRINCIPLE WHICH THE PRESENT INVENTION IS BASED ON

Figure 6:
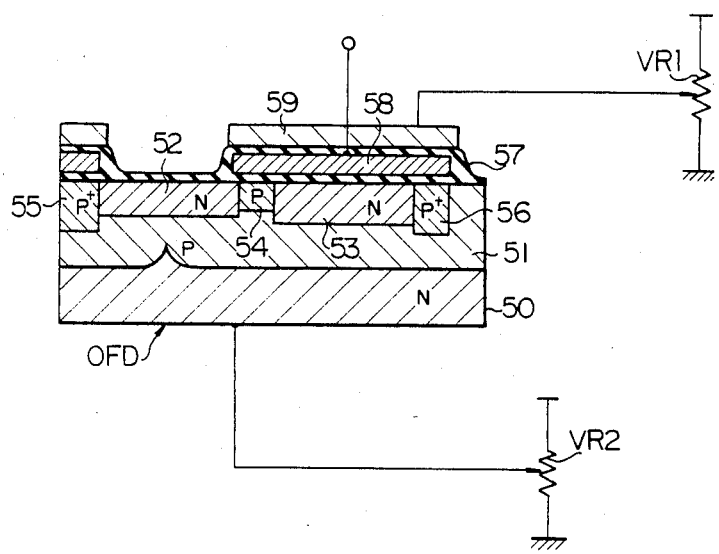
FIG. 6 is a view showing, in a modeled form, the arrangement of an image sensor according to the present invention.

Referring to FIG. 6 of the drawings, an image sensor is fabricated on an n type semiconductor substrate 50, and in the semiconductor substrate 50 is formed a p type well 51 where two n type impurity regions 52 and 53 are formed and spaced from each other by a heavily doped p type impurity region 54. The n type impurity region 52 provides a photo diode together with the p type well 51, and n type impurity region 53 serves as a single transferring stage of a vertical shift registor. The n type impurity region 52, the p type well 51 and the n type semiconductor substrate 50 form in combination an n-p-n structure which serves as a vertical overflow drain OFD. Heavily doped p type impurity regions 55 and 56 provide channel stoppers, respectively. The upper surface of the semiconductor substrate 50 is covered with an insulating film 57 of a silicon oxide, and a transferring electrode 58 is formed in the insulating film 57. The transferring electrode 58 is supplied with a read out signal, and a photo shield plate 59 is provided on the insulating film 57. The photo shield plate 59 exposes the photo diodes to an optical image, however, the other area is covered with the photo shield plate 59. The photo diode is perfectly depleted in the operation, and a floating photo shield plate is unstable. This is one of the reasons why the photo shield plate 59 need to be biased.

Figure 7:
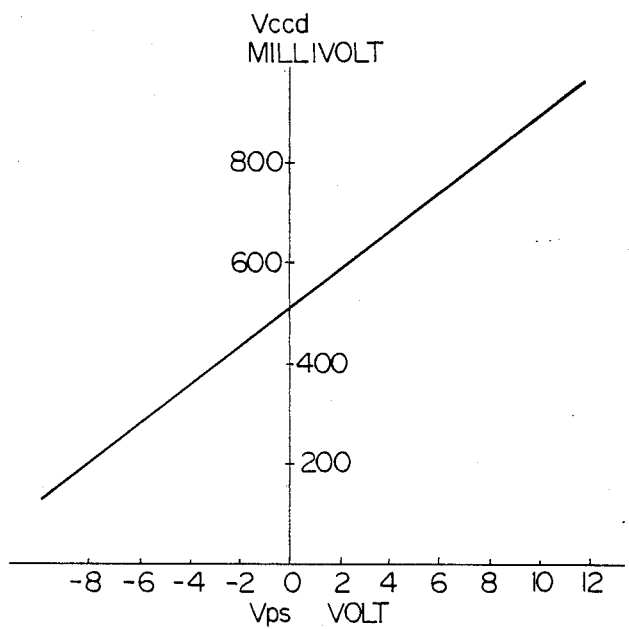
FIG. 7 is a graph showing the output voltage level of the image sensor in terms of the biasing voltage level at the photo shield plate.
Figure 8:
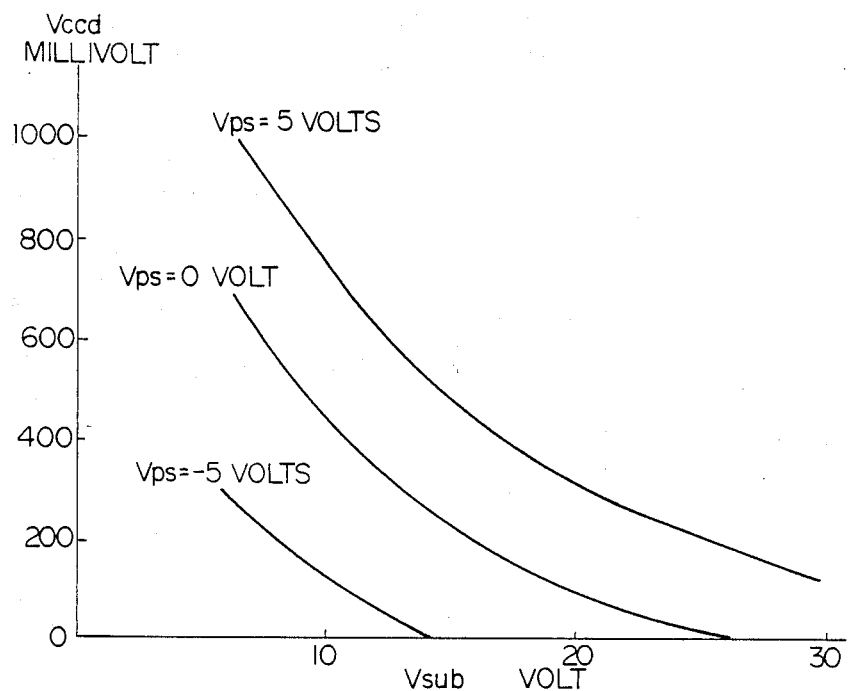
FIG. 8 is a graph showing the output voltage level of the image sensor in terms of the biasing voltage level at the semiconductor substrate.

Assuming now that the photo shield plate 59 and the semiconductor substrate 59 are respectively coupled to variable resistors VR1 and VR2, an output voltage level Vccd of the image sensor is directly proportional to the biasing voltage level Vps at the photo shield plate 59 under a constant biasing voltage level Vsub at the semiconductor substrate 50, but is decreased by increasing the biasing voltage level Vsub at the semiconductor substrate 50 under the constant biasing voltage level Vps at the photo shield plate 59. FIG. 7 shows the output voltage level Vccd of the image sensor in terms of the biasing voltage level Vps at the photo shield plate 59 under the biasing voltage level Vsub of about 10 volts. On the other hand, the relationship between the output voltage level Vccd and the biasing voltage level Vps is illustrated in FIG. 8. The biasing voltage Vsub to the output voltage Vccd characteristics are further affected by the biasing voltage level Vps at the photo shield plate 59.

Figure 9:
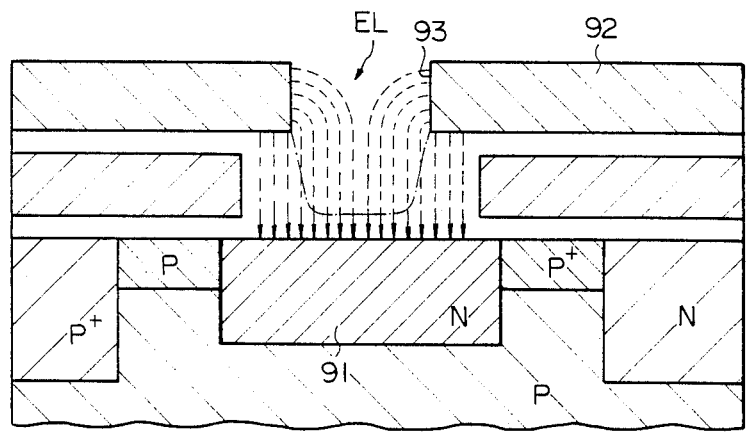
FIG. 9 is a cross sectional view of an image sensor showing the photo diode affected by the electric lines of force from the photo shield plate.

The reason why the output voltage level Vccd is directly proportional to the biasing voltage level Vps is that the amount of the electric charges accumulated in a photo diode 91 is affected by the electric lines EL of force extending from a photo shield plate 92 as shown in FIG. 9. This phenomenon is derived from the fact that a ratio of open area in the photo shield plate 92 is so small and the photo shield plate 59 is so thick that the electric lines EL of force can completely cover the surface of the photo diode 91, which allows the photo shield plate 92 to be assumed to cover the photo diode 91 in spite of the opening 93.

As described hereinbefore, the vertical overflow drain OFD is formed in the n-p-n structure, and a punch through phenomenon takes place under selection of the biasing voltage levels Vps and Vsub, because the junction between the n type impurity region 52 and the p type well is capable of being fixed in potential level by virtue of the combination of the capacitances due to the biasing voltages Vps and Vsub. If the punch through phenomenon takes place, electric charges accumulated in the photo diode are swept into the semiconductor substrate. Thus, the vertical overflow drain OFD is implemented by the simple n-p-n structure without the hole accumulating layer 44, and, for this reason, the image sensor according to the present invention is easy for fabrication.

DESCRIPTION OF THE PREFERRED EMBODIMENTS

First embodiment

Figure 10:
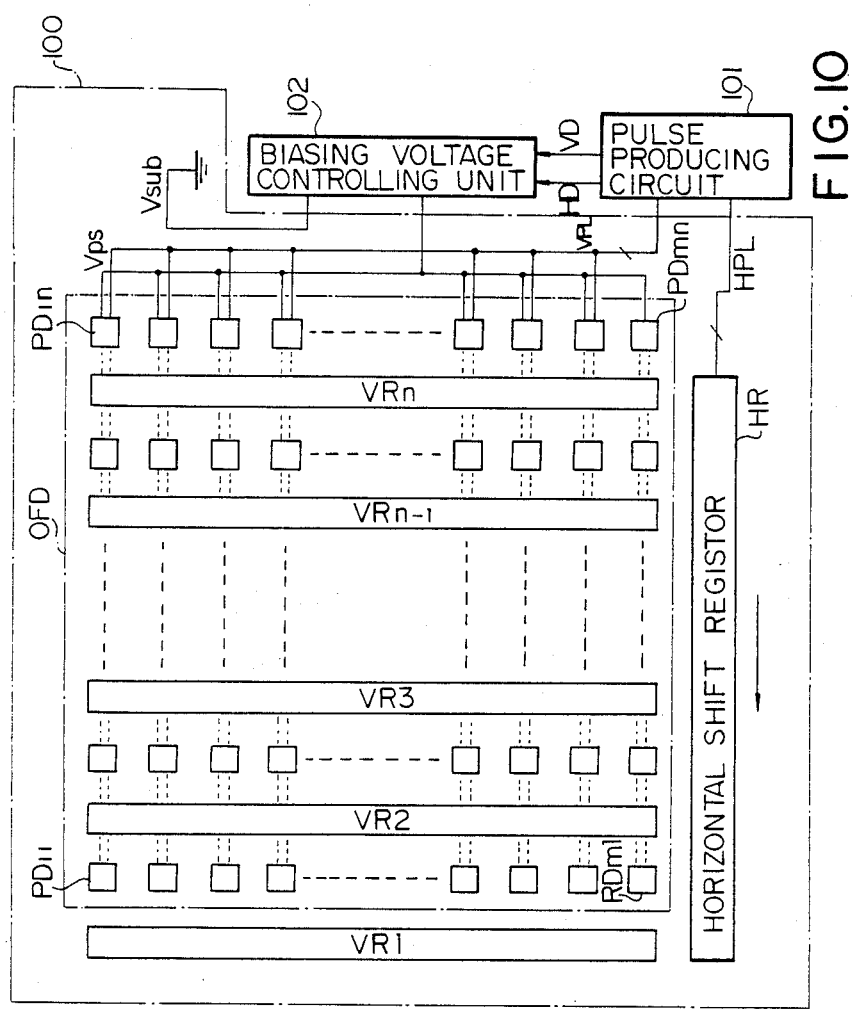
FIG. 10 is a plan view showing the arrangement of an image sensor according to the present invention.

Referring first to FIG. 10 of the drawings, an image sensor embodying the present invention is fabricated on an n type silicon substrate 100, and comprises a plurality of photo sensing elements implemented by photo diodes PD11,PD1n, ..., PDm1 and PDmn, a plurality of vertical shift registors VR1 to VRn associated with the columns of the photo diodes PD11, PD1n, ..., PDm1 and PDmn, respectively, a horizontal shift registor HR coupled to the vertical shift registors VR1 to VRn, a vertical overflow drain OFD described hereinbelow in connection with the structure of the image sensor, a pulse producing unit 101, and a biasing voltage controlling unit 102. In this instance, all of the vertical shift registors VR1 to VRn as well as the horizontal shift registor HR are implemented by charge coupled devices, respectively. The transferring pulse producing unit 101 supplies a multiple-phase vertical transferring pulse signal VPL as well as a multiple-phase horizontal transferring pulse signal HPL to the biasing voltage controlling unit 102, and the photo diode array PD11 to PDmn and the silicon substrate 100 are coupled to the biasing voltage controlling unit 102 for being supplied with a first biasing voltage signal Vps and a second biasing voltage signal Vsub, respectively. Those essential component circuits and units are further assisted by various kinds of peripheral circuit, however, no description is incorporated because of lack of necessity for understanding the present invention.

Figure 1:
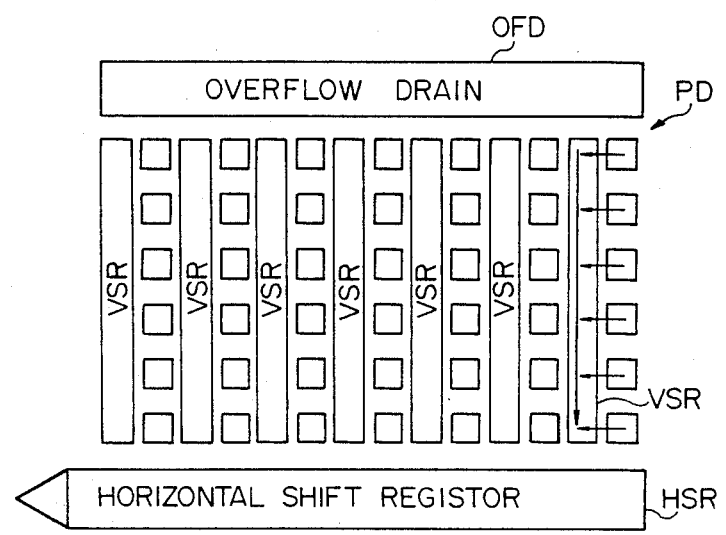
FIG. 1 is a plan view showing the layout of a prior art image sensor with an electronic shutter mode of operation.
Figure 2:
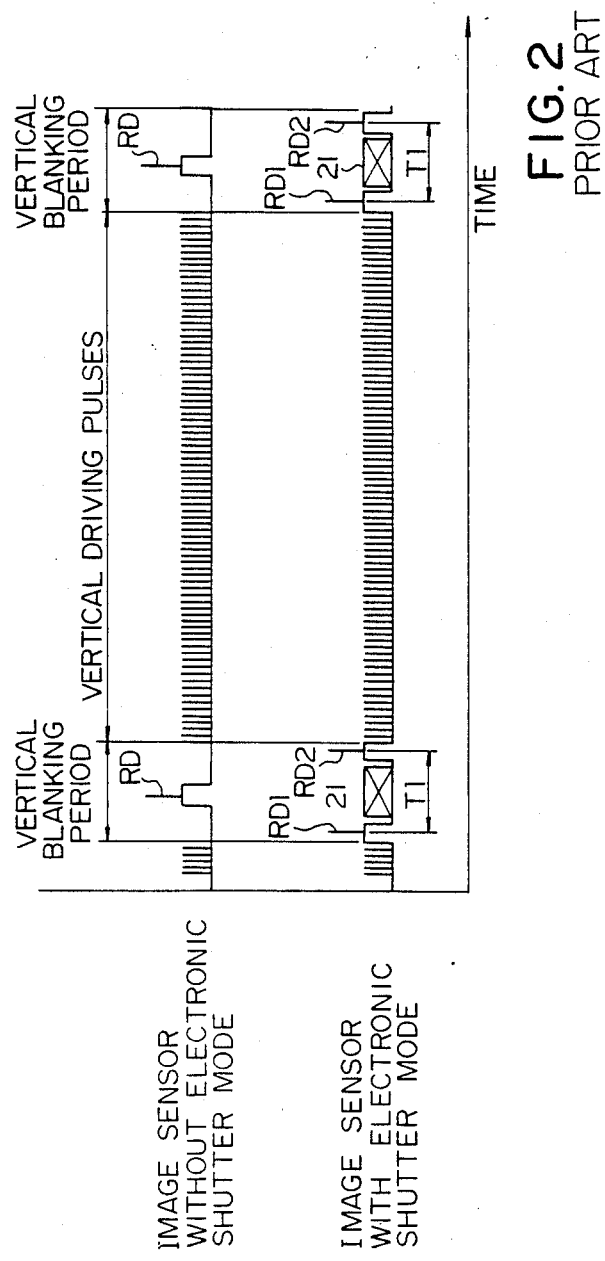
FIG. 2 is a diagram showing the waveforms of essential signals in a composite manner applied to the prior art image sensors.
Figure 3:
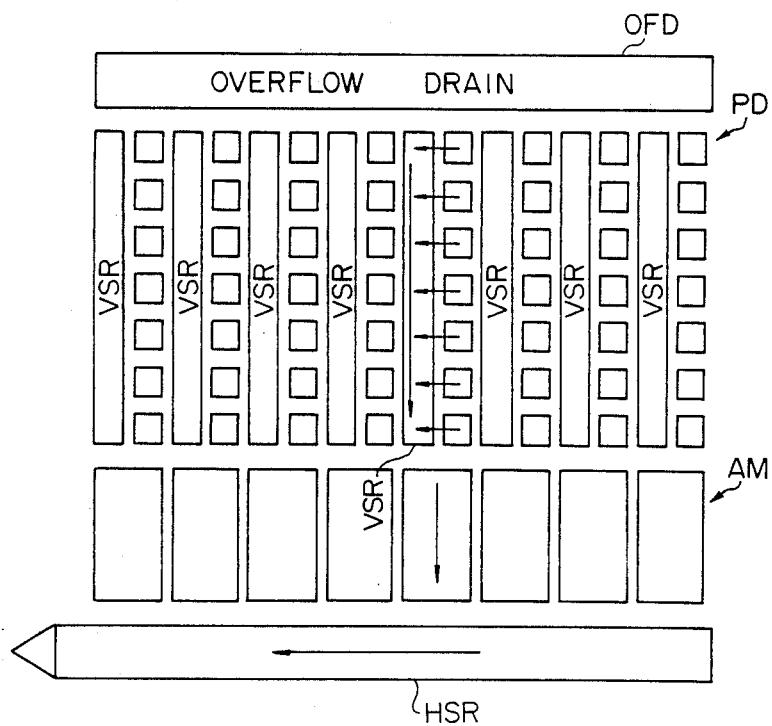
FIG. 3 is a plan view showing the layout of another prior art image sensor with a variable electronic shutter mode of operation.
Figure 4A:
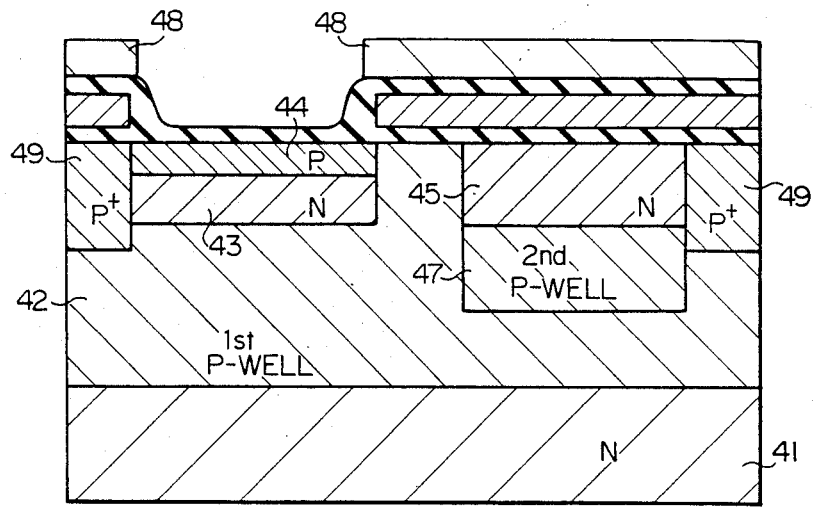
FIGS. 4A and 4B are cross sectional views showing the structures of the prior art image sensors, respectively.
Figure 4B:
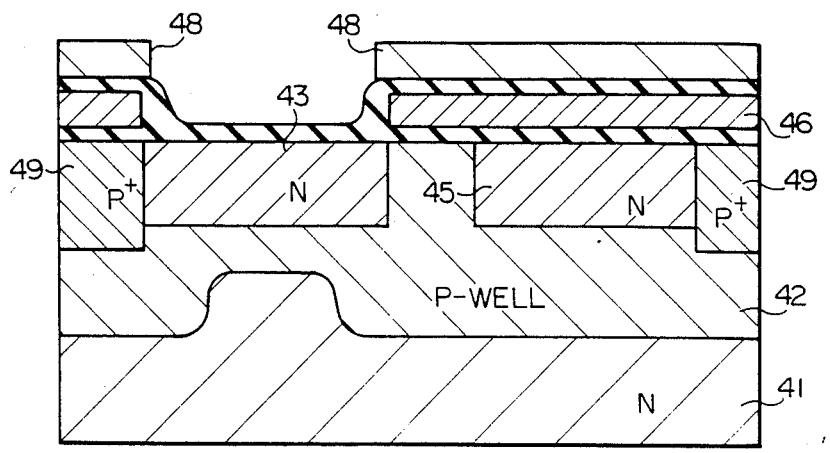
Figure 5A:
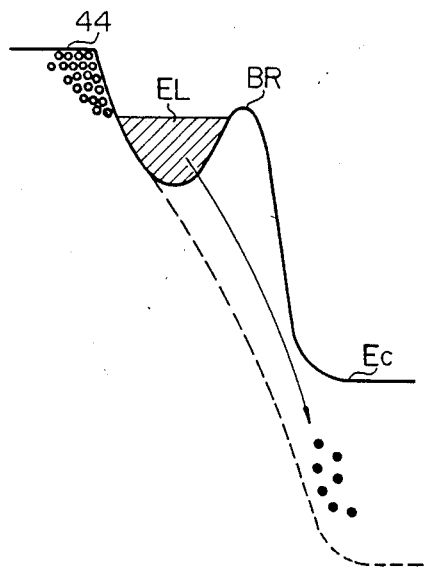
FIGS. 5A and 5B are diagrams showing the bottom edges of the conduction bands created in the image sensors shown in FIGS. 4A and 4B, respectively.
Figure 5B:
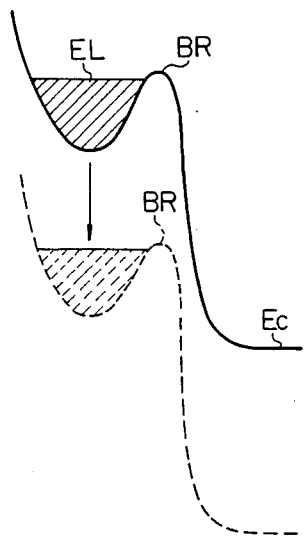
Figure 11:
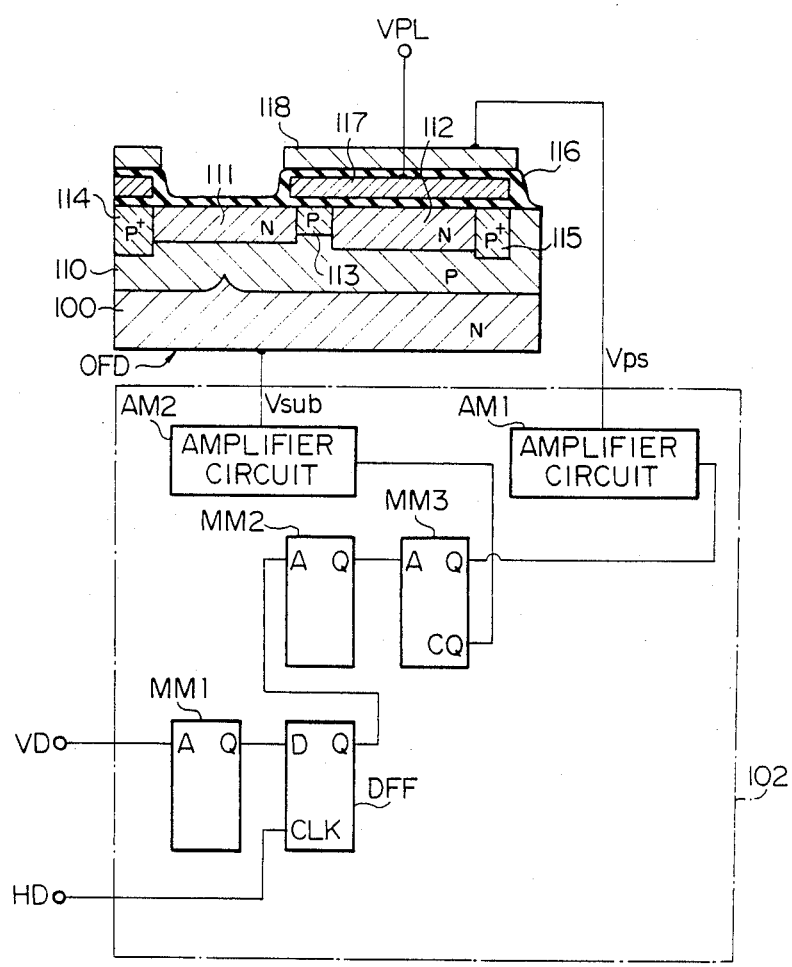
FIG. 11 is a cross sectional view showing the structure of a part of the silicon substrate where the image sensor shown in FIG. 10 is fabricated.

Turning to FIG. 11 of the drawings, the structure of a part of the silicon substrate 100 is illustrated, and a p type well 110 is formed in the silicon substrate 100. In the p type well 110 are formed two n type impurity regions 111 and 112 which are spaced apart from each other by a heavily doped p type impurity region 113. The n type impurity region 111 forms a part of one of the photo diodes PD11 to PDmn, and the n-type impurity region 112 provides a single transferring stage of one of the vertical shift registers VR1 to VRn. Though not shown in FIG. 11, a large number of n type impurity regions are formed in matrix for producing the photo diodes PD11 to PDmn. In the p type well two heavily doped p type impurity regions 114 and 115 are further formed for channel stoppers. The n type silicon substrate 100, the p type well 110 and the n type impurity regions of the photo diodes PD11 to PDmn provide an n-p-n structure which serves as a vertical overflow drain OFD. The n-p-n structure is inherently formed in an image sensor such as the ordinary image sensor illustrated in FIG. 4B, and, for this reason, the vertical overflow drain OFD is easy for fabrication without any additional impurity region such as the hole accumulating region 44 of FIG. 4A.

The entire structure is covered with an insulating film 116 of a silicon oxide, and a transferring electrodes including an electrode 117 are formed in the insulating film 116. Each of the transferring electrodes is coupled to the pulse producing unit 101, and the multiple-phase vertical transferring pulse signal VPL is periodically supplied to the transferring electrodes. On the insulating film 116 is formed a conductive photo shield plate 118 which is coupled to a biasing voltage controlling unit 102 so that the first biasing voltage signal Vps is applied to the conductive photo shield plate 118.

Figure 12:
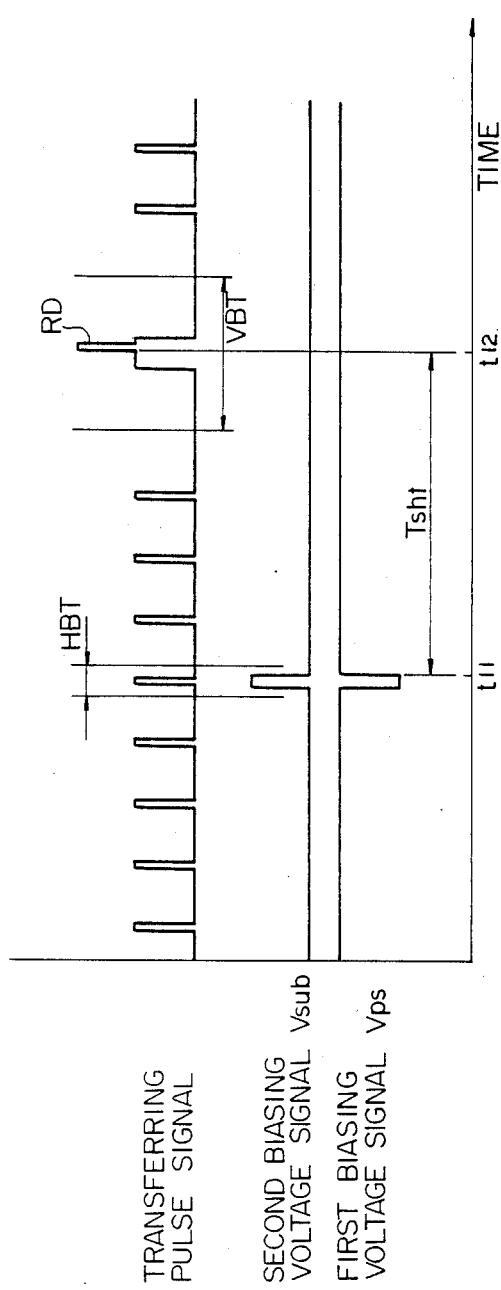
FIG. 12 is a diagram showing first and second biasing voltage signals as well as transferring pulse signals produced in the image sensor shown in FIG. 10.
Figure 13:
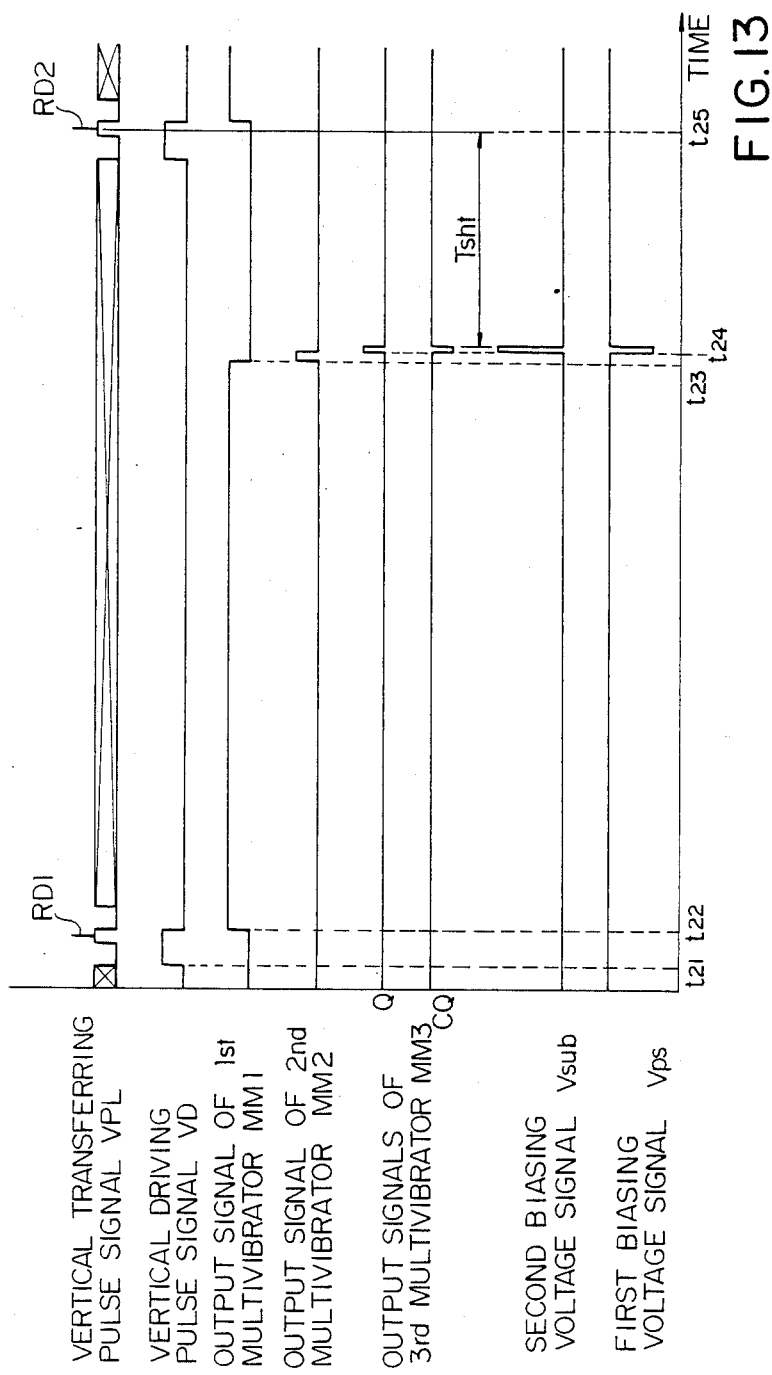
FIG. 13 is a diagram showing the waveforms of essential signals produced in the image sensor shown in FIG. 10.

The biasing voltage controlling circuit 102 comprises three monostable multivibrator circuits MM1, MM2 and MM3, a single D-type flip flop circuit DFF, and two amplifier circuits AM1 and AM2. A vertical driving pulse signal VD is supplied to the monostable multivibrator circuit MM1, and the monostable multivibrator circuit MM1 produces a high level output signal for a predetermined time period. The high level output signal of the monostable multivibrator circuit MM1 is supplied to the D-input of the flip flop circuit DFF, and a horizontal driving pulse signal HD is supplied to the clock node CLK of the flip flop circuit DFF. Then, the D flip flop circuit DFF is triggered by the horizontal driving pulse signal HD, and the high level output signal of the monostable multivibrator circuit MM1 is latched by the D flip flop circuit DFF to produce a high level output signal at the output node Q thereof. The high level output signal of the flip flop circuit DFF is supplied to the second monostable multivibrator circuit MM2 which in turn supplies a high level output signal thereof to the third monostable multivibrator circuit MM3. The output nodes Q and CQ of the third monostable multivibrator circuit MM3 are respectively coupled to the amplifier circuits AM1 and AM2, so that the amplifier circuits AM1 and AM2 produce the first and second biasing voltage signals Vps and Vsub which are opposite in polarity to each other as shown in FIGS. 12 and 13. In this instance, the first biasing voltage signal Vps swings its voltage level between about +5 volts and about −10 volts, and the second biasing voltage signal Vsub swings its voltage level between about 40 volts and about 10 volts. The high voltage level of the first biasing voltage signal Vps allows the photo diodes PD11 to PDmn to accumulate sufficient electric charges, and the low voltage level of the first biasing voltage signal Vps is low enough to deplete the accumulated electric charges from the photo diodes. The high voltage level of the second biasing voltage signal Vsub is causative to sweeping all of the accumulated electric charges into the silicon substrate 100, and the low voltage level of the second biasing voltage signal Vsub allows the punch through phenomenon to take place in the n-p-n structure. Since the first and second biasing voltage levels Vps and Vsub are opposite in polarity to each other, the junction between the n type impurity region 111 and the p type well 110 is being fixed in potential by virtue of the capacitances due to the first and second biasing voltage signals Vps and Vsub. Although the photo diodes PD11 to PDmn are of the type having the depleted junction, the accumulated electric charges can be swept into the silicon substrate 100 in so far as the potential of the junction is fixed.

Description is hereinbelow made for operation with reference to FIG. 12 and, concurrently, FIG. 13. In this instance, the vertical and horizontal driving signals are applied in such a manner that the leading edges and the trailing edges of the first and second biasing voltage signals Vps and Vsub take place in a horizontal blanking time period HBT as shown in FIG. 12, and this arrangement is conducive to eliminate undesirable shifting noises from an image reproduced on a display (not shown). However, the first and second voltage biasing signals may be produced in a vertical blanking time period VBT for the same purpose. When the first and second biasing voltage signals Vps and Vsub take place at time t11, ineffectual electric charges are swept from the photo diodes PD11 to PDmn into the vertical overflow drain OFD by the agency the punch through phenomenon, and effectual electric charges are read out from the photo diodes PD11 to PDmn at time t12 in the presence of the read out signal RD. Then, the effectual electric charges are accumulated in the respective photo diodes PD11 to PDmn for a time period Tsht in the presence of an optical image from an object, and, for this reason, a shutter speed is calculated from the time period Tsht.

Turning to FIG. 13 of the drawings, the vertical driving pulse signal VD takes place at time t21, the first monostable multivibrator circuit MM1 produces the high level output signal at time t22. The high level output signal of the multivibrator circuit MM1 is latched by the D-flip flop circuit DFF in the presence of the horizontal driving pulse signal HD (not shown in FIG. 13) produced between time t22 and time t23, and the second monostable multivibrator circuit MM2 is triggered by the output signal of the flip flop circuit DFF so as to produce the high level output signal at time t23. The high level output signal of the second monostable multivibrator circuit MM2 is supplied to the third monostable multivibrator circuit MM3, so that the complementary output signals are supplied from the third monostable multivibrator circuit MM3 to the amplifier circuits AM1 and AM2 at time t24, respectively. The amplifier circuit AM2 produces the extremely high level second biasing voltage signal Vsub, but the amplifier circuit AM1 supplies the negative first biasing voltage signal Vps to the conductive photo shield plate 118.

With the first and second biasing voltage signals Vps and Vsub, the potential levels of the n type impurity regions for parts of the photo diodes PD11 to PDmn are hardly fluctuated, and, for this reason, the punch through phenomena take place in the vertical overflow drain OFD. This results in that the ineffectual electric charges are swept from the photo diodes PD11 to PDmn into the silicon substrate 100, and accumulations of effectual electric charges start after the recovery of the potential levels of the n type impurity regions. Upon completion of the accumulations, the read out signal RD takes place at time t25 for conducting the photo diodes PD11 to PDmn to the associated vertical shift registors VR1 to VRn, and the effectual electric charges are transferred to the vertical shift registors VR1 to VRn. The effectual electric charges thus read out are transferred to the horizontal shift register HR in response to the multiple-phase vertical transferring signal VPL, and the horizontal shift register HR in turn transfers the effectual electric charges to the outside thereof in synchronization with the multiple-phase horizontal transferring pulse signal HPL. Thus, the first and second biasing voltage signals Vps and Vsub are produced between two read out signals RD1 and RD2, and a shutter time period Tsht is defined between the lapse of time from the first and second biasing voltage signals Vps and Vsub and the read out signal RD2. In this instance, a shutter speed ranging between about a sixtieth and less than a thousandth is achieved by virtue of the vertical overflow drain OFD.

Second embodiment

Figure 14:
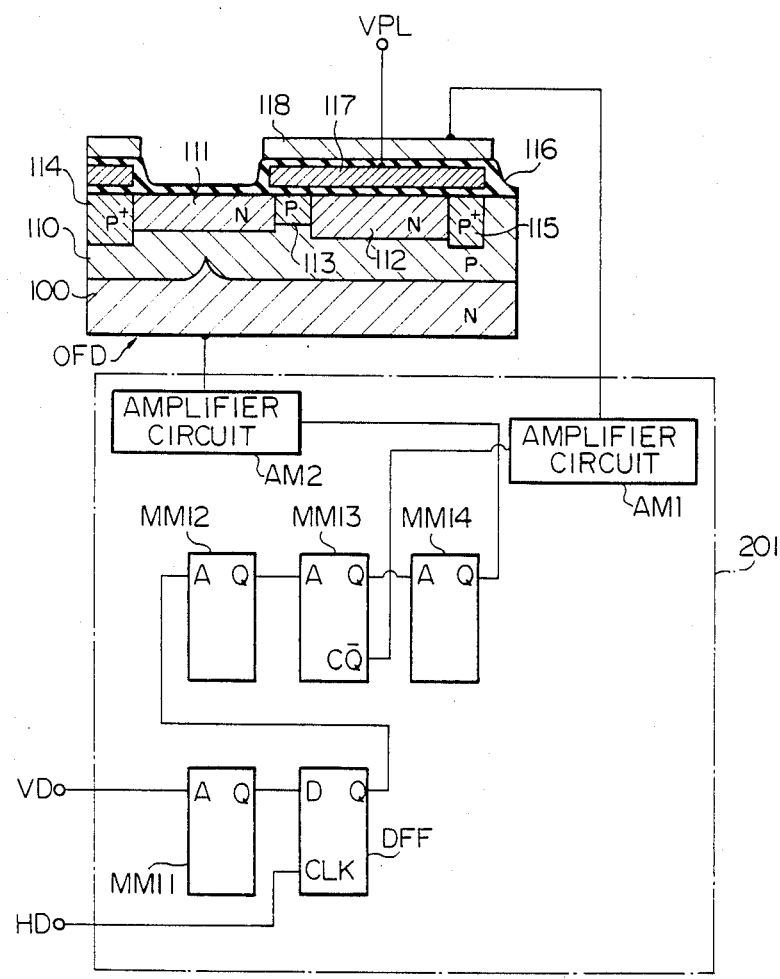
FIG. 14 is a cross sectional view showing the structure of a part of another image sensor embodying the present invention.

Turning to FIG. 14 of the drawings, a part of an image sensor embodying the present invention is illustrated, and is similar in arrangement to the image sensor shown in FIGS. 10 and 11 with the exception of a biasing voltage controlling unit 201, so that component parts are designated by the identical reference numerals and symbols without detailed description for the sake of simplicity.

Figure 15:
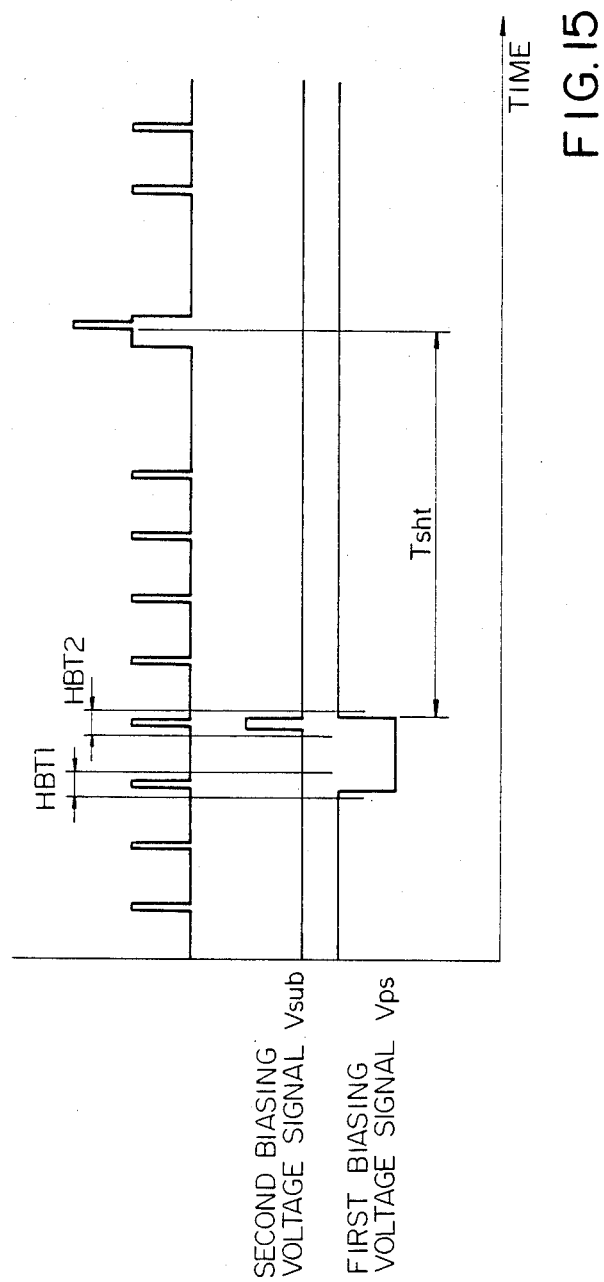
FIG. 15 is a diagram showing first and second biasing voltage signals produced in the image sensor shown in FIG. 14.
Figure 16:
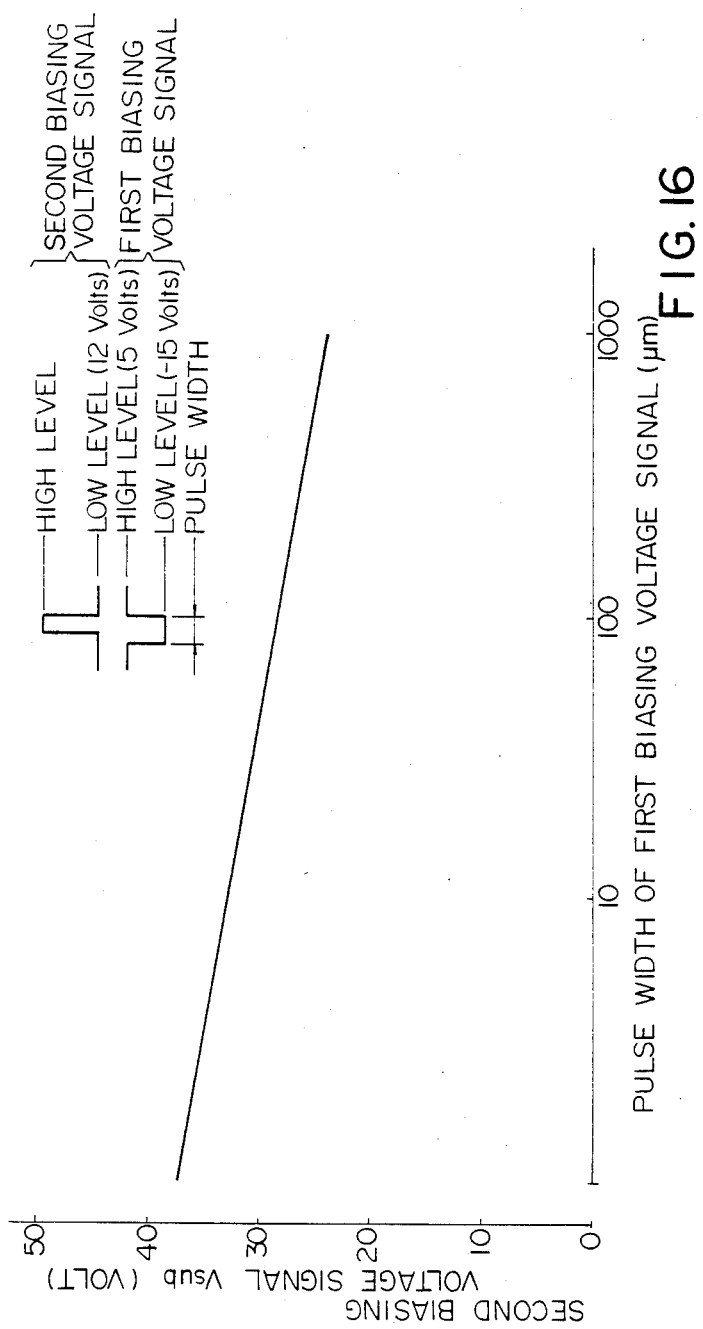
FIG. 16 is a graph showing the effective voltage level of the second biasing voltage signal in terms of the pulse width of the first biasing voltage signal.

The biasing voltage controlling unit 201 comprises four monostable multivibrator circuits MM11, MM12, MM13 and MM14, a D-type flip flop circuit DFF and two amplifier circuits AM1 and AM2. Differences from the controlling unit 102 are arrangement of the monostable multivibrator circuits MM12 to MM14 and connection to the amplifier circuits AM1 and AM2. Namely, the monostable multivibrator circuits MM12 to MM14 are coupled in cascade, and the amplifier circuits AM1 and AM2 are respectively coupled to the respective output nodes of the monostable multivibrator circuits MM14 and MM13. In the biasing voltage controlling unit 201 thus arranged, the first biasing voltage signal Vps goes down prior to the second biasing voltage signal Vsub as shown in FIG. 15. The leading edge of the first biasing voltage signal Vps is changed in a horizontal blanking time period HBT1, and the trailing edge of the first biasing voltage signal Vps is recovered in the subsequent horizontal blanking time period HBT2. Thus, the first biasing voltage signal Vps remains in the active low voltage level over two horizontal blanking time periods HBT1 to HBT2. The effective pulse amplitude of the second biasing voltage signal Vsub depends on the pulse width of the first biasing voltage signal Vps as shown in FIG. 16, and the high level of the second biasing voltage signal Vsub can be decreased if the first biasing voltage signal Vps is increased in the pulse width. Since the first biasing voltage signal Vps remains in the low voltage level over the two horizontal blanking time periods, the high level of the second biasing voltage Vsub is lowered in comparison with the first embodiment.

As will be understood from the foregoing description, the overflow drain incorporated in the image sensor according to the present invention is simple in the structure, and, for this reason, is improved in the productivity and, accordingly, the production yield. Since the image sensor of the present invention is capable to being established into the electronic shutter mode of operation without any memory and any high frequency transferring pulse signal.

Although particular embodiments of the present invention have been shown and described, it will be obvious to those skilled in the art that various changes and modifications may be made without departing from the spirit and scope of the present invention. For example, the amplifier circuits AM1 may be associated with an inverter circuit, and is coupled to the Q node.

What is claimed is:

1. An image sensor of an interline transfer type fabricated on a semiconductor substrate of a first conductivity type and established into an electronic shutter mode and a charge transferring mode of operation, comprising:

(a) a plurality of photo sensing elements arranged in rows and columns and operative to accumulate effectual electric charges in said electronic shutter mode of operation and ineffectual electric charges out of the electronic shutter mode of operation in the presence of optical images, said photo sensing elements being formed by a plurality of impurity regions of said first conductivity type defined in a well of a second conductivity type provided in said semiconductor substrate;

(b) a plurality of vertical shift registors coupled to the columns of said photo sensing elements, respectively, and operative to receive said effectual electric charges from said photo sensing elements in the presence of a read out signal produced in a vertical blanking time period and to transfer said effectual electric charges in response to a multiple-phase vertical transferring signal in said charge transferring mode of operation, said vertical shift registors being formed in said well;

(c) a horizontal shift register coupled to said vertical shift registors for transferring said effectual electric charges fed from said vertical shift registors in response to a multiple-phase horizontal transferring signal;

(d) a pulse producing unit operative to produce said multiple-phase vertical transferring signal, said multiple phase-horizontal transferring signal, a vertical driving signal and a horizontal driving signal;

(e) a conductive photo shield plate provided over said well and having an opening exposing said photo sensing elements to said optical images; and (f) a biasing voltage controlling unit responsive to said vertical and horizontal driving signals for producing first and second biasing signals and operative to respectively supply said first and second biasing signals to said photo shield plate and said semiconductor substrate before producing said read out signal, said electronic shutter mode of operation being established in a lapse of time from recoveries of said first and second biasing voltage signals to a production of said read out signal, in which a vertical overflow drain is formed by a combination of said semiconductor substrate, said well and said impurity regions, and in which said first and second biasing voltage signals have respective first voltage levels selected in such a manner that punch through phenomena take place in said vertical overflow drain for sweeping said ineffectual electric charges into said semiconductor substrate.

2. An image sensor as set forth in claim 1, in which said first and second biasing signals are concurrently produced in opposite polarity to each other.

3. An image sensor as set forth in claim 2, in which said charge transferring mode of operation has a horizontal blanking time period between two vertical blanking time periods, and in which said first and second biasing voltage signals take place in said horizontal blanking time period.

4. An image sensor as set forth in claim 3, in which said biasing voltage controlling unit comprises a first monostable multivibrator circuit supplied with said vertical driving signal, a D-type flip flop circuit supplied at the input node thereof with the non-inverted output signal of the first monostable multivibrator circuit and at the clock node thereof with said horizontal driving signal, a second monostable multivibrator circuit supplied with the non-inverted output signal of the D-type flip flop circuit, a third monostable multivibrator circuit supplied with the non-inverted output signal of the second monostable multivibrator circuit, a first amplifier circuit supplied with the non-inverted output signal of the third monostable multivibrator circuit and coupled to said photo shield plate, and a second amplifier circuit supplied with the inverted output signal of the third monostable multivibrator circuit and coupled to the semiconductor substrate.

5. An image sensor as set forth in claim 3, in which said first biasing voltage signal has a second voltage level for allowing said photo diodes to accumulate said effectual electric charges and the first voltage level for causing the potential level at the interface between said impurity regions and said well not to fluctuate in the presence of said second biasing voltage signal of the first voltage level.

6. An image sensor as set forth in claim 5, in which said first biasing voltage signal has a second voltage level for preventing said photo diodes from conducting said semiconductor substrate and the first voltage level for allowing said punch through phenomena to take place.

7. An image sensor as set forth in claim 6, in which said first and second conductivity types are dominated by donor impurities and acceptor impurities, respectively.

8. An image sensor as set forth in claim 7, in which the first and second voltage levels of said first biasing voltage signal are about −10 volts and about 5 volts, respectively.

9. An image sensor as set forth in claim 8, in which the first and second voltage levels of said second biasing voltage signal are about 40 volts and about 10 volts, respectively.

10. An image sensor as set forth in claim 1, in which said first biasing voltage signal remains in the first voltage level longer than the fist voltage level of said second biasing voltage signal, in which said first and second biasing voltage signals are produced in opposite polarity to each other.

11. An image sensor as set forth in claim 10, in which said charge transferring mode of operation has at least first and second horizontal blanking time periods between two vertical blanking time periods, and in which the leading edge of said first biasing voltage signal takes place in said first horizontal blanking time period, wherein the leading and trailing edges of said second biasing voltage signal and the trailing edge of said first biasing voltage signal take place in said second horizontal blanking time period.

12. An image sensor as set forth in claim 11, in which said biasing voltage controlling unit comprises a first monostable multivibrator circuit supplied with the vertical driving signal, a D-type flip flop circuit supplied at the input node thereof with the non-inverted output signal of the first monostable multivibrator circuit and at the clock node thereof with said horizontal driving signal, a second monostable multivibrator circuit supplied with the non-inverted output signal of the D-type flip flop circuit, a third monostable multivibrator circuit supplied with the non-inverted output signal of the second monostable multivibrator circuit, a fourth monostable multivibrator circuit supplied with the non-inverted output signal of the third monostable multivibrator circuit, a first amplifier circuit supplied with the inverted output signal of the third monostable multivibrator circuit and coupled to said photo shield plate, and a second amplifier circuit supplied with the non-inverted output signal of the fourth monostable multivibrator circuit and coupled to the semiconductor substrate.

* * * * *

UNITED STATES PATENT AND TRADEMARK OFFICE
CERTIFICATE OF CORRECTION

PATENT NO. : 4,977,584
DATED : December 11, 1990
INVENTOR(S) : Akiyoshi Kohno et al It is certified that error appears in the above-identified patent and that said Letters Patent is hereby corrected as shown below:

Column 1, line 33, delete "coped", and insert --cope--;

Column 12, line 15, delete "fist", and insert --first--.

Signed and Sealed this

Twenty-ninth Day of September, 1992

*Attest:*

DOUGLAS B. COMER

*Attesting Officer*     *Acting Commissioner of Patents and Trademarks*